(12) United States Patent
Denison

(10) Patent No.: US 7,671,408 B2
(45) Date of Patent: Mar. 2, 2010

(54) VERTICAL DRAIN EXTENDED MOSFET TRANSISTOR WITH VERTICAL TRENCH FIELD PLATE

(75) Inventor: Marie Denison, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/169,967

(22) Filed: Jul. 9, 2008

(65) Prior Publication Data
US 2010/0006931 A1 Jan. 14, 2010

(51) Int. Cl.
*H01L 29/76* (2006.01)
*H01L 29/94* (2006.01)

(52) U.S. Cl. .................. 257/330; 257/331; 257/332; 257/334; 257/488; 257/E29.118

(58) Field of Classification Search .................. 257/330, 257/331, 332, 334, 488, E29.118
See application file for complete search history.

(56) References Cited

U.S. PATENT DOCUMENTS

| | | | |
|---|---|---|---|
| 7,339,237 B2 * | 3/2008 | Meyer | 257/349 |
| 2004/0108567 A1 * | 6/2004 | Denison et al. | 257/500 |
| 2009/0233407 A1 * | 9/2009 | Disney | 438/268 |

OTHER PUBLICATIONS

"Folded Gate LDMOS with Low On-Resistance and High Transconductance", Shuming Xu, Yuanzheng Zhu, Pang-Dow Foo, Yung C. Liang and Johnny K.O. Sin, IEEE, 2000, pp. 55-58.

* cited by examiner

*Primary Examiner*—Ngan Ngo
(74) *Attorney, Agent, or Firm*—Warren L. Franz; Wade J. Brady, III; Frederick J. Telecky, Jr.

(57) ABSTRACT

A vertical drain extended metal-oxide semiconductor field effect (MOSFET) transistor or a vertical double diffused metal-oxide semiconductor (VDMOS) transistor includes: a buried layer having a first conductivity type in a semiconductor backgate having a second conductivity type; an epitaxial (EPI) layer having the first conductivity type and formed above the buried layer; a deep well having the first conductivity type in the EPI layer extending down to the buried layer; at least one shallow well having the second conductivity type in the EPI layer; a shallow implant region having the first conductivity type and formed in the shallow well; a gate electrode having a lateral component extending over an edge of the shallow well and stopping at some spacing from an edge of the shallow implant and having a vertical trench field plate extending vertically into the EPI layer.

24 Claims, 10 Drawing Sheets

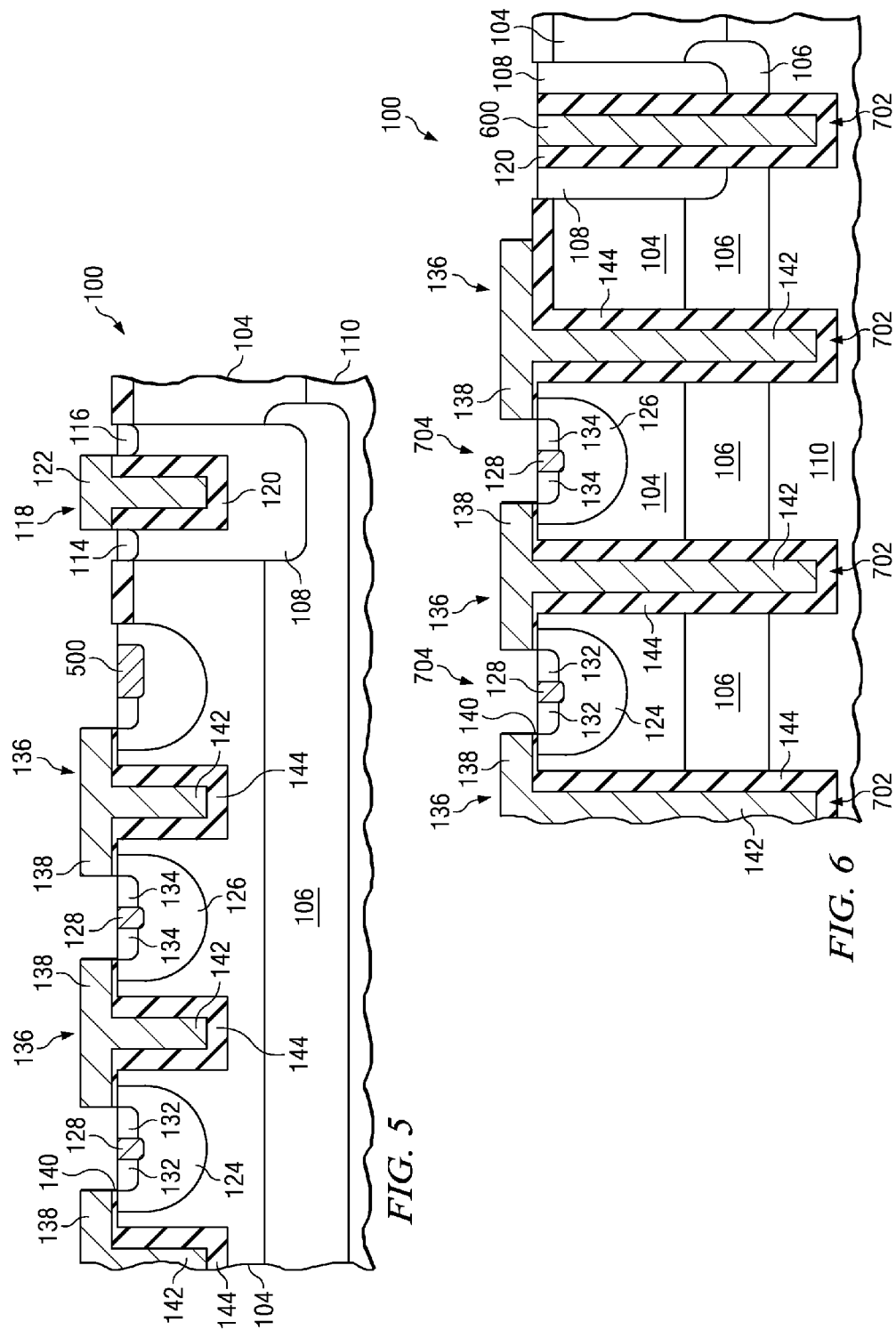

VERTICAL DRAIN EXTENDED MOSFET TRANSISTOR WITH VERTICAL TRENCH FIELD PLATE

FIELD

The disclosure herein relates generally to designing and fabricating a vertical drain extended metal-oxide semiconductor field effect (MOSFET) transistor and more specifically to a vertical double diffused metal-oxide semiconductor (VDMOS) transistor with a vertical trench field plate.

BACKGROUND

In some types of power transistor devices, a variable known as the specific on-resistance $R_{SP}$ is a meaningful figure of merit. In essence, $R_{SP}$ tells a designer how much area is needed for a device to realize a certain resistance. In mathematical terms, $R_{sp}=R_{dson}*area$. For example, if a device has an on-resistance of 100 mΩ and an area of 1 mm², it would have an $R_{SP}$ of 100 mΩ*mm². Thus, if the designer had a new circuit that needed an on-resistance of 200 mΩ, the designer could cut the area of the device in half (i.e., use a device with an area of 0.5 mm²). Ideally, designers would like $R_{SP}$ to be as small as possible.

SUMMARY

The following presents a summary to provide a basic understanding of one or more aspects of the disclosure herein. This summary is not an extensive overview. It is intended neither to identify key or critical elements nor to delineate scope of the disclosure herein. Rather, its primary purpose is merely to present one or more aspects in a simplified form as a prelude to a more detailed description that is presented later.

A VDMOS transistor includes: a buried layer having a first conductivity type in a semiconductor body (substrate) having a second conductivity type; an epitaxial (EPI) layer having the first conductivity type and formed above the buried layer; a deep well having the first conductivity type in the EPI layer extending down to the buried layer; a shallow well having the second conductivity type in the EPI layer; a shallow implant region having the first conductivity type and formed in the shallow well; a gate electrode having a lateral component extending over an edge of the shallow well and stopping at some spacing from an edge of the shallow implant and having a vertical trench field plate extending vertically into the EPI layer.

The following description and annexed drawings set forth certain illustrative aspects. Other aspects, advantages and/or features may, however, become apparent from the following detailed description when considered in conjunction with the annexed drawings.

BRIEF DESCRIPTION OF THE DRAWINGS

FIG. 5 shows a cross-sectional view of another embodiment of a VDMOS transistor with a backgate termination;

FIG. 6 shows a cross-sectional view of another embodiment of a VDMOS transistor;

DETAILED DESCRIPTION OF THE INVENTION

Figure 1:
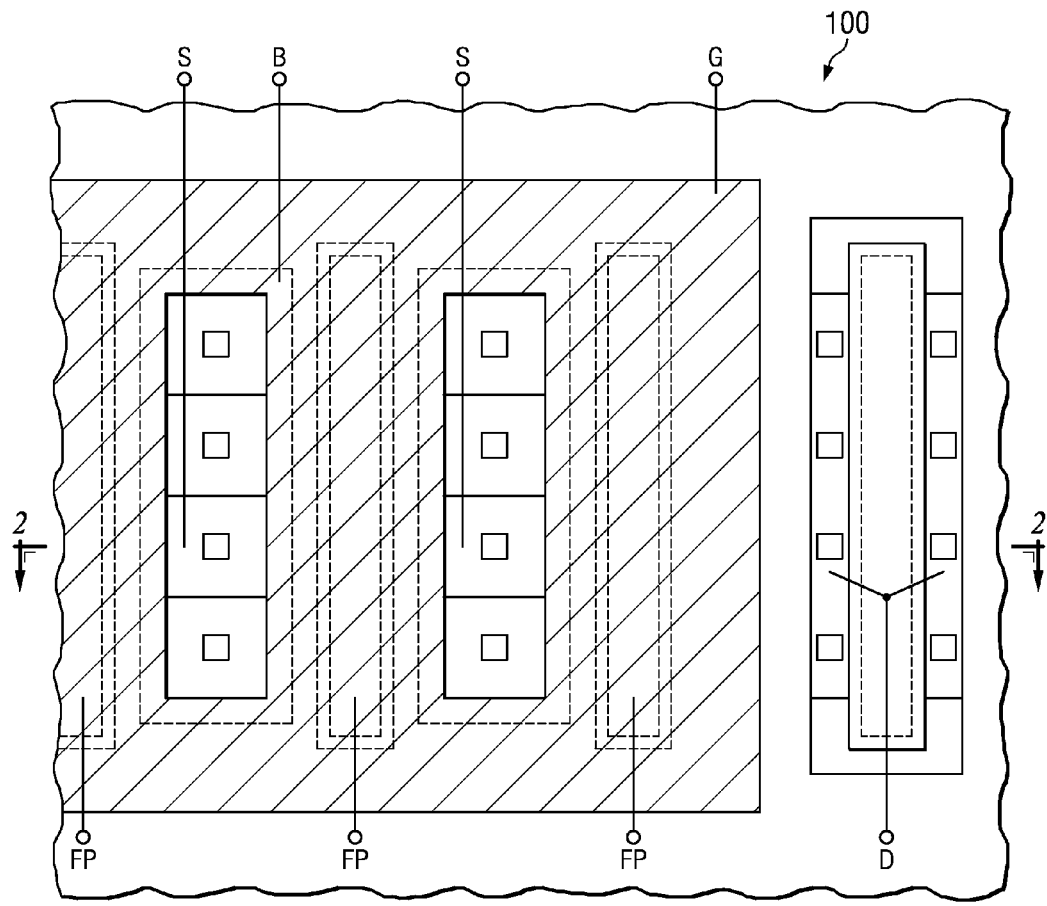
FIG. 1 shows a layout top view of an embodiment of one embodiment of a VDMOS transistor.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one skilled in the art, that one or more aspects described herein may be practiced with a lesser degree of these specific details. In other instances, known structures and devices are shown in block diagram form to facilitate understanding. In the examples of this disclosure, the semiconductor regions are doped using either dopant implantation or deposition of a doped material at the surface of the semiconductor material followed by diffusion into the semiconductor material. Patterned doped regions are assumed to be obtained by means of traditional lithographic techniques, for example, where lithography broadly refers to processes for transferring one or more patterns between various media.

As will be appreciated in more detail further herein, aspects of the present invention relate to a VDMOS transistor that includes a gate electrode with lateral components and vertical trench field plates. The vertical trench field plates allow lateral depletion to occur along their vertical surfaces in addition to vertical depletion occurring at a backgate to drain extension junction. Therefore, the VDMOS transistor 100 has more depletion than previously available with conventional lateral gates and lateral field plates. This increased depletion gives the VDMOS transistor 100 a greater breakdown voltage for a given EPI doping and thickness or allows a reduced EPI thickness or a higher EPI doping and thus a reduced on-resistance for a given breakdown voltage.

Figure 2:
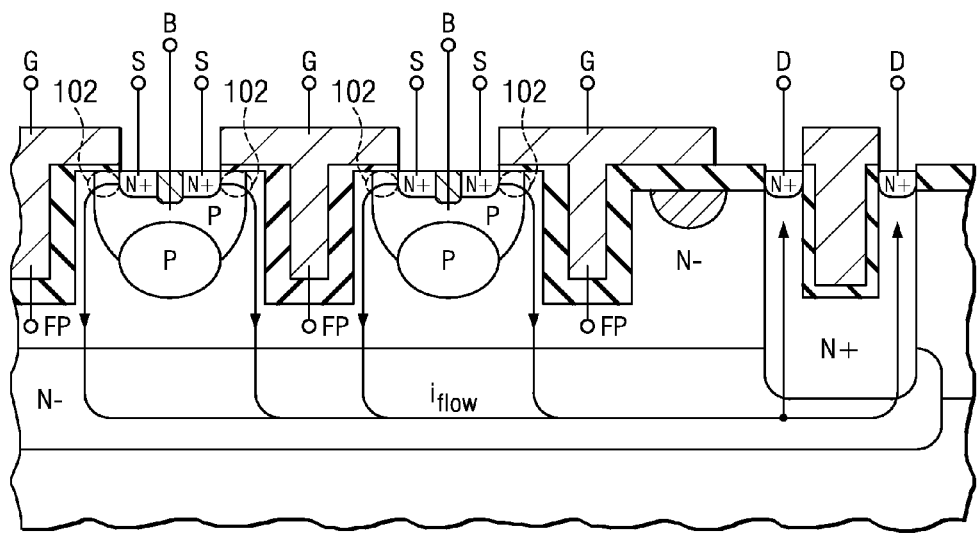
FIG. 2 shows a cross-sectional view of the VDMOS transistor of FIG. 1.

To understand how one example of a VDMOS transistor may function, reference is made to FIGS. 1-2. FIG. 1 shows a top-view of a VDMOS transistor, and FIG. 2 shows a cross-sectional view as indicated. Like many transistors, the VDMOS transistor may be thought of as including four terminals, namely a source terminal (SOURCE labels, which may be shorted together), a drain terminal ("D" labels, which may be shorted together), a gate terminal ("G" labels which may be shorted together), and a backgate terminal ("B" labels, which may be shorted together). The substrate body can be connected to backgate and source or be connected to a separate terminal.

During device operation, a gate-source voltage, $V_{GS}$ is applied to the gate G (and optionally to a vertical trench field plate FP) relative to the source S and backgate B, thereby opening a lateral channel 102 between the source S and drain well (e.g. EPI). Current flows ($i_{flow}$) vertically from the channel 102 through the drain, which collects the current from all source/backgate cells and directs it to contacts at the sides of or around the active area of the source/backgate cells.

When the drain to source voltage $V_{DS}$ is applied, an electric field is created between the drain well and the backgate in the vertical direction. The electric field is also created between the drain well and the vertical trench field plates in the lateral direction. This electric field sweeps away the charged carriers to form a depleted region. The increased depletion effect caused by the vertical trench field plates allows either an increase in the doping of the drain well, or a decrease in the epitaxial thickness for a given breakdown voltage. Either case results in a lower specific on-resistance Rsp for the device in comparison to existing devices. Alternatively, for a given drain well doping and epitaxy layer thickness, the breakdown voltage can be increased without increasing Rsp.

Accordingly, the VDMOS transistor 100 has a lower specific turn-on resistance ($R_{SP}$) than what has hereforeto been achievable, where $R_{sp}=R_{dson}*$area. As an example, the device 100 can have an $R_{SP}$ of approximately 40 m$\Omega$*mm$^2$ with a breakdown voltage of approximately 80V.

Figure 3:
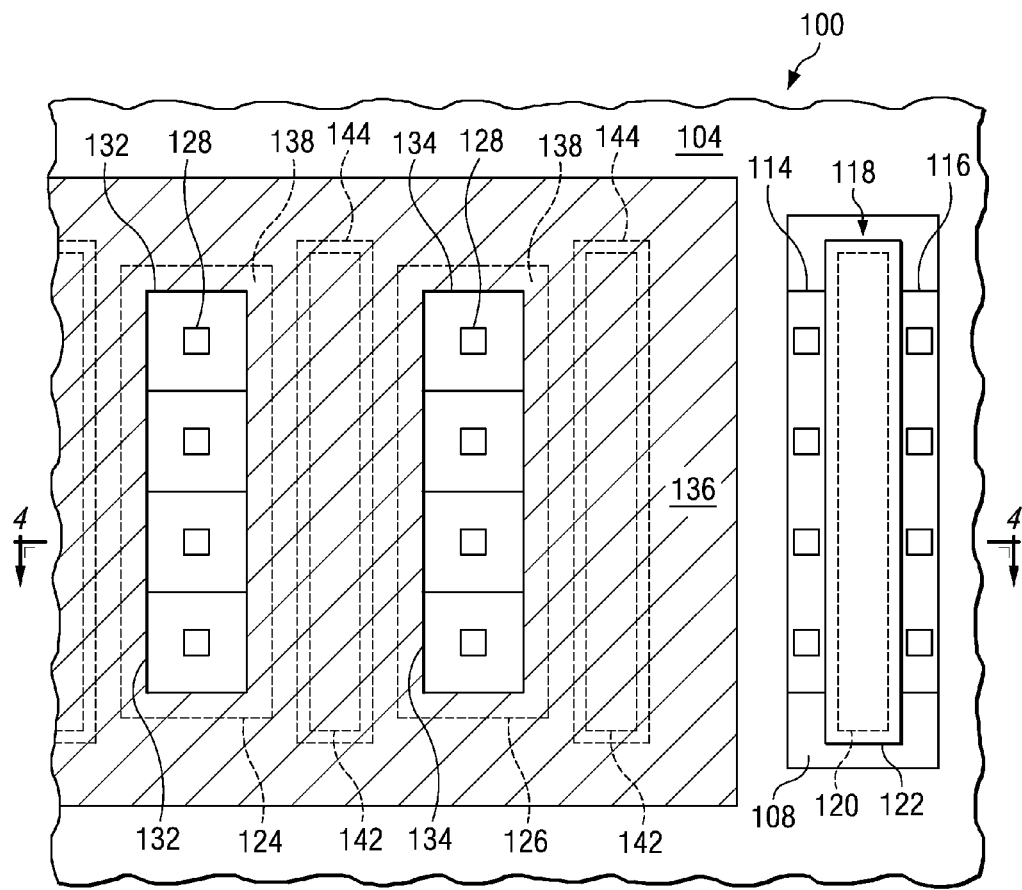
FIG. 3 shows a layout top view of an embodiment of a VDMOS transistor.
Figure 4:
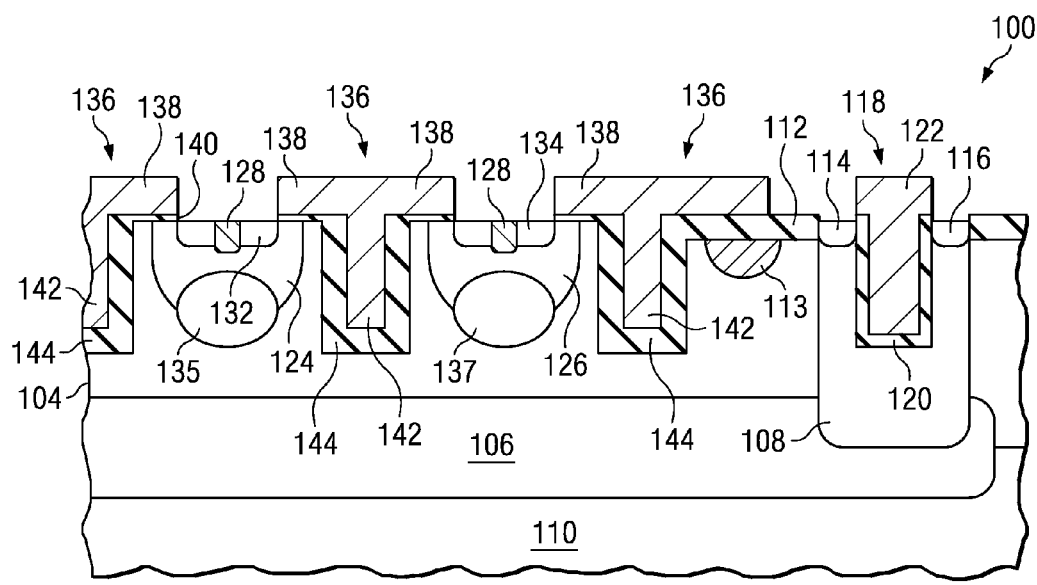
FIG. 4 shows a cross-sectional view of the VDMOS transistor of FIG. 3.

Now that a brief functional description has been set forth, a more detailed structural discussion of a VDMOS transistor 100 is provided with reference to FIGS. 3-4. For purposes of clarity, this discussion may use the functional terms drain, backgate, source, and gate; thereby highlighting some specific examples of structures that could achieve the aforementioned functionality.

As shown, the drain of the transistor 100 may include several elements to achieve the aforementioned functionality, namely an epitaxial (EPI) layer 104, a buried layer 106, and a deep well 108. These elements may form an unbroken enclosure around the active region of the device, and work in conjunction with one another to collect current in an efficient manner.

The buried layer 106 has the first conductivity type (e.g., n-type, such as N+), and is formed over the substrate 110. It has the function to collect the current from the MOS devices located above it in the EPI layer 104.

The EPI layer 104 has also a first conductivity type (e.g., n-type, such as N−) and is formed over the buried layer 106. Alternatively, the EPI layer 104 can be initially grown with a second conductivity type and then be counter-doped to the first conductivity type (e.g., n-type, N−) by implantation. Typically, the dopant concentration of the EPI layer 104 is less than the dopant concentration of the buried layer 106 as well as the dopant concentration of other subsequently formed regions having the first conductivity type.

The deep well 108 also has the first conductivity type (e.g., n-type, such as N+) and is formed in the EPI layer 104. The deep well 108 extends downward from the surface of the EPI layer to the buried layer 106 around at least part of the region where the MOSFET source/backgate regions are laid out. The deep well 108 may abut or be substantially aligned with an isolation region 112, such as STI or field oxide, that is formed on the surface of the EPI layer 104. An optional termination well of second conductivity type 113 can be used under the isolation 112 for the purpose of termination breakdown optimization.

The drain can include a first shallow implant 114 and second shallow implant 116 having the first conductivity type (e.g., n-type, such as N+), wherein the first and second shallow implants 114, 116 are formed in the deep well 108 to realize a low-ohmic contact between silicon and backend of line metallization.

A trench 118 comprising an outer dielectric layer 120 and optionally an inner polysilicon layer 122 may also be optionally formed in the deep well 108. This trench can have the same dimensions and materials as a field plate, but can also have different dimensions and materials, depending on the implementation. If present, the trench 118 may extend vertically from the surface of the EPI layer 104 into the deep well 108 above the buried layer 106 and may abut the first and second shallow implants 114, 116. By conformally doping the edges of trench 118 prior to filling the trench with dielectric (or other material), the trench 118 facilitates the formation of an extremely narrow deep n-well 108, as opposed to a wide deep n-well implanted at the EPI surface, which after diffusion extends laterally nearly as much as vertically. Alternatively, the dielectric can be opened at the bottom of the trench, which can be filled by a conductive material to form a direct contact to the buried layer 106. Other trench fillings involving no dielectric material are also contemplated as falling within the scope of the invention.

The backgate of the transistor 100 may comprise a series of shallow wells with the second conductivity type (e.g., p-type, such as P) that are formed in the EPI layer 104 and laterally spaced from the deep well 108. The illustrated embodiment shows a first shallow well 124 and a second shallow well 126 having the second conductivity type, although the invention is also equally applicable to a single shallow well or many more shallow wells of this type. To allow access to the shallow wells, a contact implant having the second conductivity type (e.g., p-type, such as P+) is formed within each shallow well. Thus, in FIG. 4's cross section, a first contact implant 128 is formed in the first shallow well 124 and second contact implant 130 is formed in the second shallow well 126.

The source terminal of the transistor may comprise a number of shallow implant regions having the first conductivity type (e.g., n-type, such as N+). Often, these shallow implant regions are shorted together to act as a single source for the device. For example, in FIG. 3, the source comprises shallow implants 135, 137 that are self-aligned with the backgate well (double diffused well), and a higher doped surface implant 132, 134 around every other contact along the device width. In general any number of shallow implant regions could be formed.

In DMOS transistors used as power switches or drivers, it is usual to have the source and backgate contacts short-circuited. FIG. 3 shows an area efficient way to realized such short-cut, a metal-1 layer connects all alternating p+/n+ contacts to the same terminal. In other cases where backgate bias control is desired, the source and backgate contact diffusions can be isolated from each other, for instance as long fingers separated by STI.

Although these shallow implant regions (e.g., 132, 134) are shown as square-like features, in other embodiments the shallow implant regions could have other geometries, such as finger-like features that are long and narrow.

The gate terminal of the transistor includes a gate electrode 136 with lateral components 138 extending over edge portions of the third and fourth shallow wells 124, 126 in the EPI layer 104. A gate dielectric 140 separates the lateral components 138 of the gate electrode from the EPI layer 104 and shallow wells 124, 126.

As shown, the gate electrode 136 may have a ring-like configuration, where fingers of the gate electrode are shorted together and at least partially abut the shallow implant regions 132, 134, thereby providing an connection between source and MOS channel. However, in other configurations, a single rectangular or square-like gate electrode could be used instead of this ring-like structure. The ring-like structure can be advantageous for breakdown/field plating engineering at the termination of the source/backgate area.

Notably, the gate electrode 136 also includes vertical trench field plates 142 that extend vertically into the EPI layer 104. A field plate dielectric 144 separates each vertical trench field plate 142 from the EPI layer 104. In some embodiments, the field plate dielectric 144 may be relatively-thick when compared to the relatively-thin gate dielectric 140.

Figure 8:
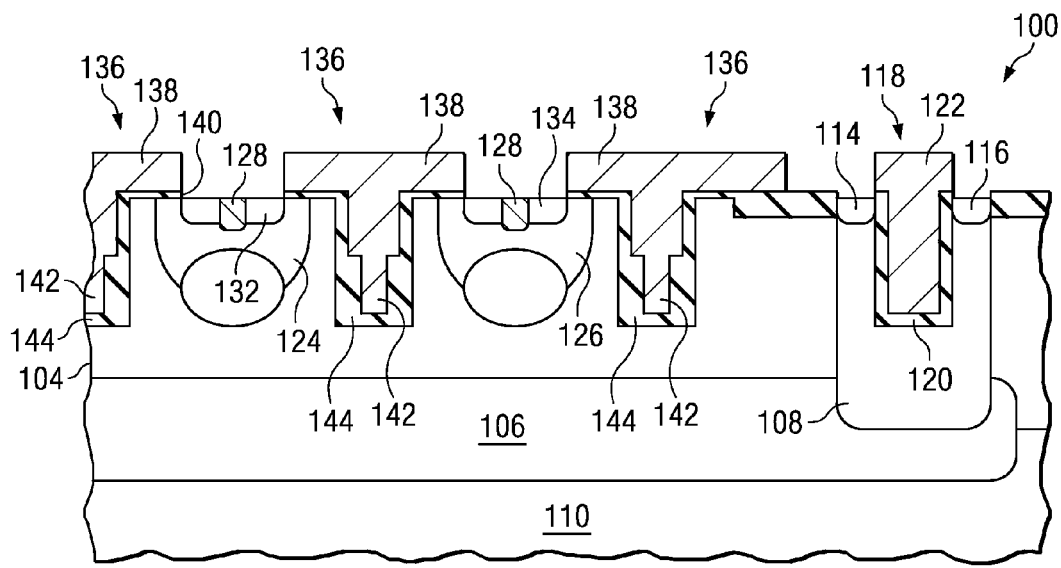
FIG. 8 shows a cross-sectional view of an embodiment of a VDMOS transistor having variable trench dielectric thickness.

Also, the thickness of the field plate dielectric 144 may vary along the trench depth, width and length. FIG. 8, for example shows an embodiment where the thickness of the field plate dielectric 144 is varied from top to bottom. In other un-illustrated embodiments, the thickness of the field plate dielectric can also be tapered continuously or sloped. Thanks to this, the field plate capacitance and thus the depletion effect is stronger at the top where the drain voltage is low (no risk of oxide breakdown). At the bottom of the trench, the oxide can be thicker to limit the electric field from becoming too high (either in the oxide or at the trench surface in the silicon).

As mentioned, the vertical trench field plates 142 may be asserted to increase drain extension depletion and thereby effectively reducing the Rsp or increasing the source-drain breakdown voltage of the VDMOS transistor 100. Although some vertical trench field plates are shown as fingerlike regions that are laterally spaced between the first and second shallow wells 124, 126, in other embodiments the vertical trench field plates 142 could have other geometries. For example, the field plates could completely laterally surround the shallow wells 124, 126 in relation with termination breakdown design.

FIG. 5 shows another cross-sectional view of an embodiment where a backgate contact 500 is nearest to the deep well 108, rather than a floating termination p-well 113 under field oxide 112.

Figure 7:
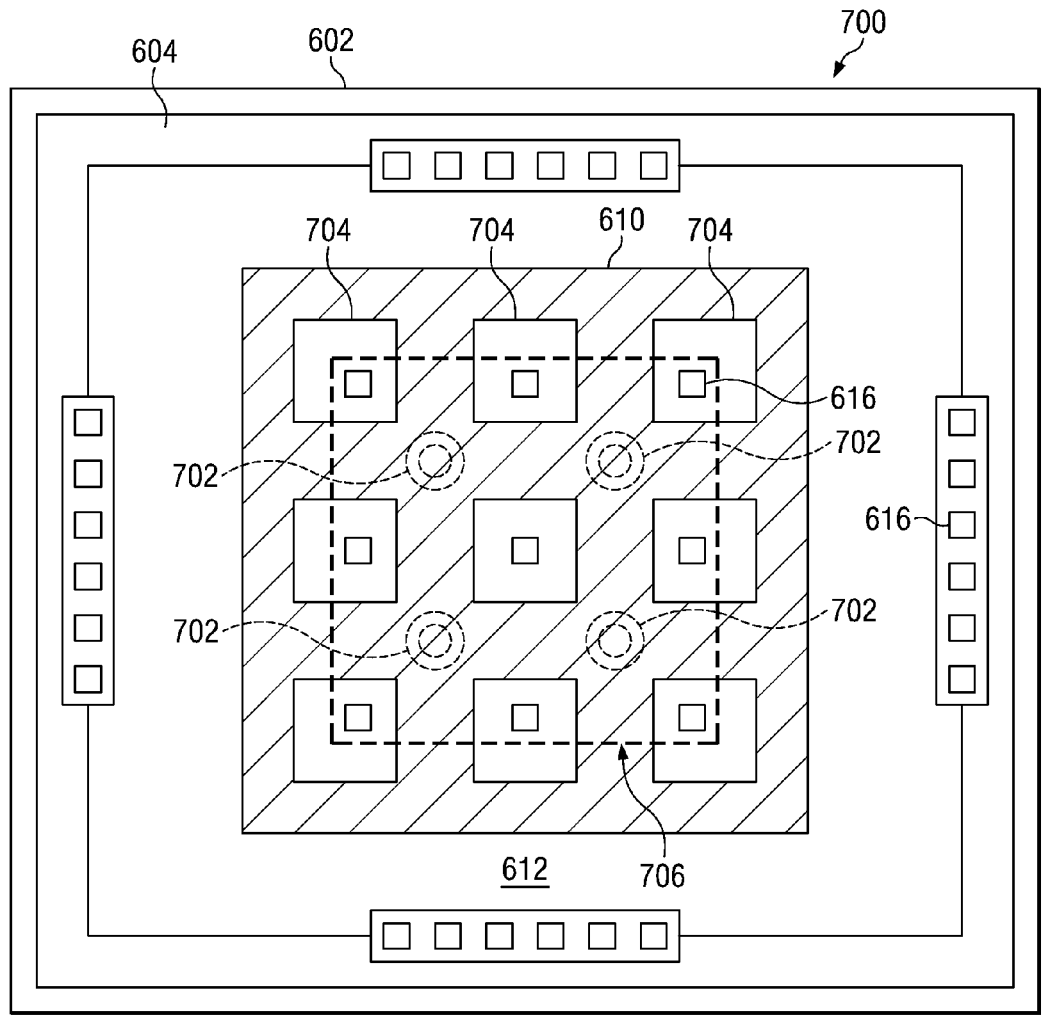
FIG. 7 shows the layout top view of an embodiment of a VDMOS transistor with rectangular source cells and a deep well drain ring at the device periphery.

In FIGS. 6-7, one can see another embodiment that includes deep trench isolation plugs 702 between backgate/source cells 704. FIG. 6 shows a cross sectional embodiment while FIG. 7 shows the corresponding top view. One reason for forming deep trench isolation plugs 702 between backgate/source cells 704 is that an opening in buried layer 106 is desirable toward the deep well 108, otherwise if the deep trench would form full stripes it would block the current flow toward the drain since these deep isolation trenches are cutting through buried layer 106. The advantage of using DTI is that one spares one mask by re-using the deep trench isolation as DMOS field plate. Furthermore, FIGS. 6-7's embodiment differs from that of FIG. 1 because the deep well 706 is implanted in a "ring" pattern, wherein the "ring" pattern is an unbroken rectangle extending along the periphery of the device and enclosing all features of the device except the buried layer 106. FIGS. 6-7 show merely one example of this type of layout, and one of ordinary skill in the art will appreciate that there are many possibilities including leaving the vertical field plate floating.

Depending on the design rules for the minimum opening of the source and minimum size of the gate, designers may choose to use varying shape source cells to achieve desired device performance. Previous figures display only a few possible geometries of source cells, but the inventors have contemplated the use of many varying shapes of source cells in conjunction with the present invention (e.g., hexagonal).

Figure 9:
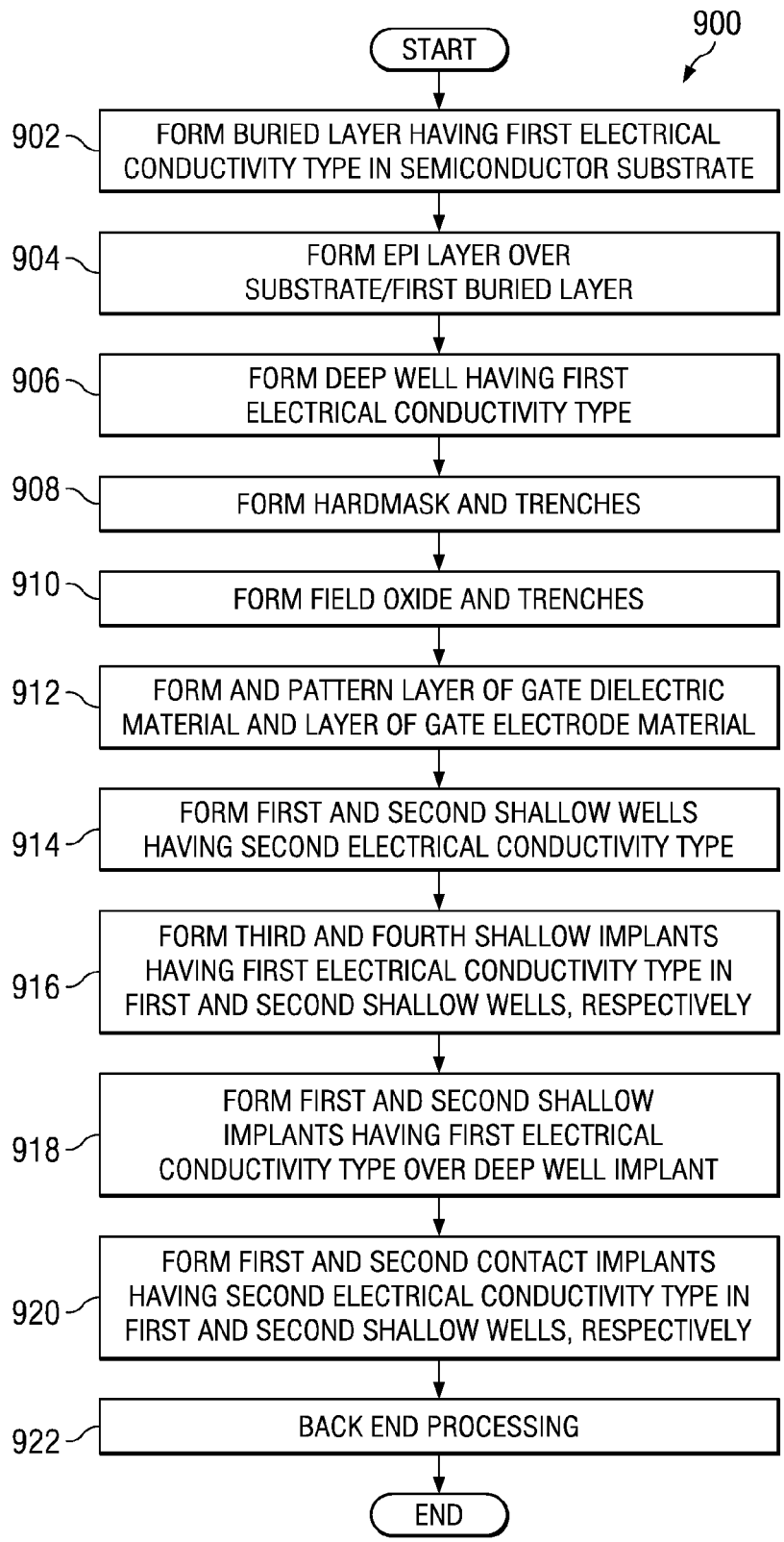
FIG. 9 is a flow diagram illustrating an exemplary methodology for fashioning a VDMOS transistor in accordance with one embodiment.

Now that some illustrative devices have been illustrated and described, reference is made to FIG. 9, which shows a flow diagram of an exemplary methodology 900 for forming a VDMOS transistor as illustrated and discussed. To show a specific example of how FIG. 9 could be implemented, FIGS. 10-21 show a series of cross sectional views of the VDMOS transistor of FIGS. 1-2 at various stages of manufacture. Although these cross-sectional views show one example of how the VDMOS transistor 100 could be formed, there are also other ways in which the transistor could be formed that also fall within the scope of the present invention. While method 900 is illustrated as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Further, one or more of the acts depicted herein may be carried out in one or more separate acts and/or phases.

Figure 10:
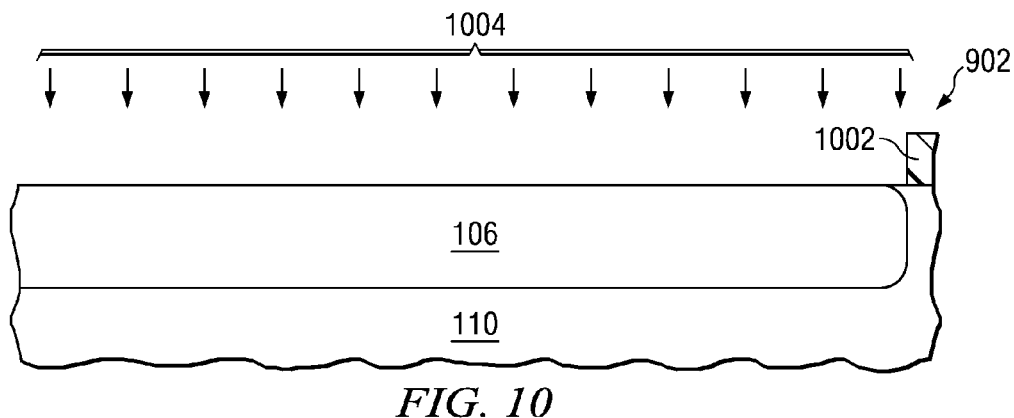
FIGS. 10-20 are cross-sectional views of a VDMOS transistor at various stages of manufacture, consistent with one example of FIG. 9's methodology.

Referring now to FIG. 10 (902), a layer of photoresist 1002 is patterned to expose portions of the semiconductor substrate 110. A buried layer region 106 having a first conductivity type (e.g., n or p type) is then formed in the semiconductor substrate 110, often by implanting 1004 an ionized n-type or p-type species into the exposed portions. The buried layer 106 is usually heavily doped to minimize the drain resistance of the VDMOS device. In effect, the buried layer 106 will serve to extend the drain region of the VDMOS device to extend under portions of the backgate of the device. In technologies using deep trench isolation as opposed to junction isolation, the buried layer implant can be made over the complete chip area (blanket implant, no mask is necessary).

It will be appreciated that substrate as referred to herein may comprise any type of semiconductor body and also non semiconductor materials like oxide in SOI, partial SOI substrate, polysilicon, amorphous silicon, organic materials. This includes, but is not limited to: one or several combined wafers or wafer dice as well as any other type of semiconductor/non-semiconductor and/or deposited or grown (e.g. epitaxial) layers formed thereon and/or otherwise associated therewith.

Figure 11:
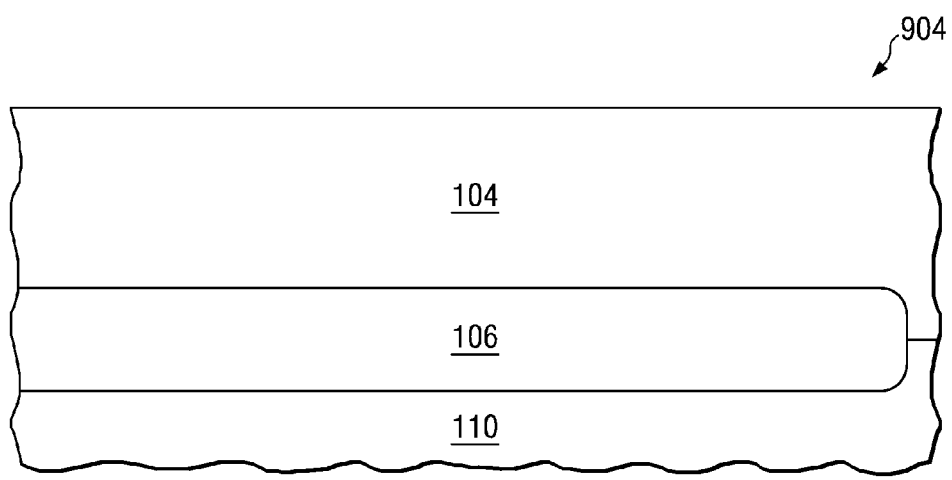

In FIG. 11 (904) an epitaxial or EPI layer 104 having the first conductivity type is formed (e.g., grown) over the surface of the substrate 110. The depth of the EPI layer depends on the voltage rating of the device, it is typically between 2 um and 15 um in the 20-200V range. The EPI layer 104 may have the first conductivity type as formed and/or one or more dopants may be subsequently added thereto to instill the first conductivity type in the EPI layer 104. In any event, the dopant concentration of the EPI layer 104 is less than the dopant concentration of the buried layer 106 (as well as the dopant concentration of other subsequently formed regions having the first conductivity type). Additionally, processing conditions associated with forming the EPI layer 104, such as elevated temperatures, for example, may promote some dopant diffusion.

The term epitaxial layer as used in this disclosure is intended as a broadly reaching term and is not meant to solely comprise epitaxially grown layers. While the device of this disclosure may be built using an epitaxial layer, it does not require the use of an epitaxially grown layer. Non-epitaxially grown layers (like Silicon over Insulator layers) which are doped to have the first conductivity may comprise a layer equivalent to the epitaxial layer as referred to in this disclosure. The inventor has contemplated the use of a wide range of materials which may comprise the epitaxial layer of the disclosure.

Although not illustrated, an optional termination well having the second conductivity type can be formed in the EPI layer 104 in FIG. 11 (see e.g., termination well 113 in FIG. 4). The termination well may form a (floating or non-floating) termination ring, for example, and is spaced apart from the first well 108. One will appreciate that the termination of a VDMOS can be achieved in different ways and consider this topology as an example.

Figure 12:
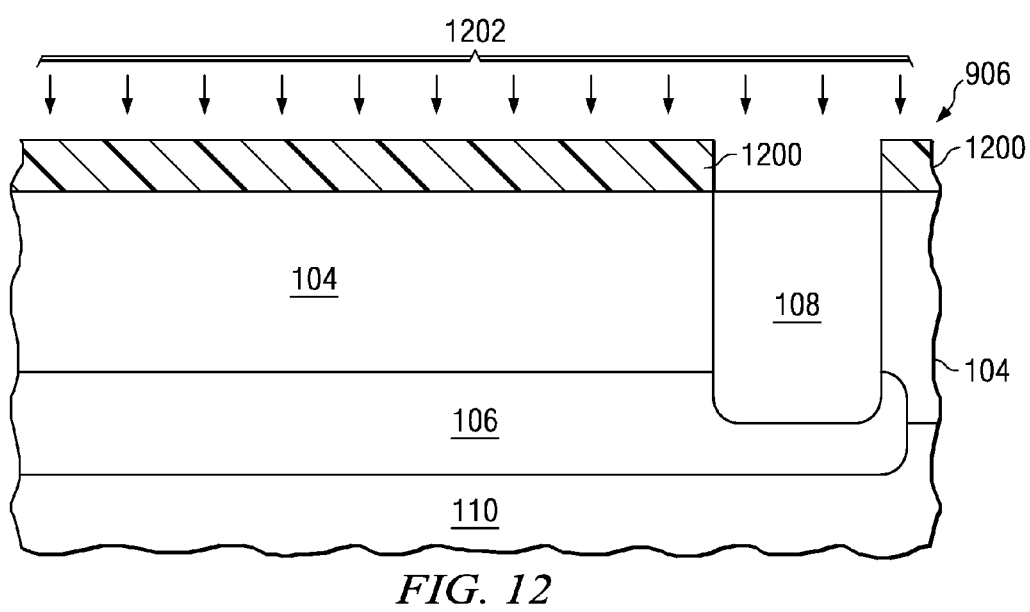

In FIG. 12 (906), another photoresist mask 1200 is formed, through which another implant 1202 is carried out. In this manner, a deep well 108 having the first conductivity type is formed in the EPI layer 104 down to the buried layer 106. The deep well 108 ideally extends at least slightly into the buried layer 106 to ensure a reliable connection therebetween. The deep well 108 has preferably a peak dopant concentration close to that of the buried layer 106. It should be low-ohmic to minimize the resistance of the VDMOS up-drain terminal component.

Figure 13:
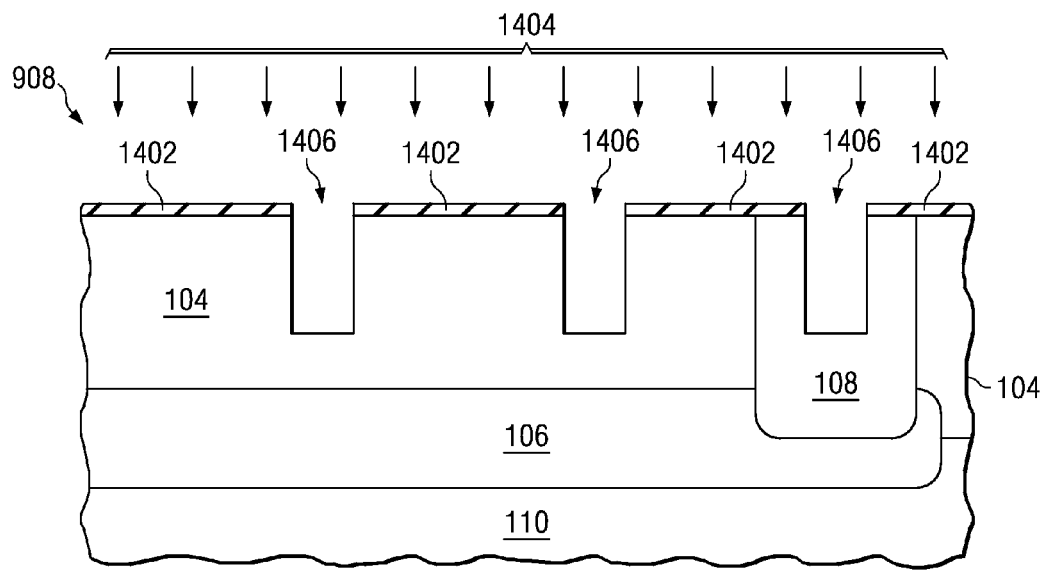

In FIG. 13 (908), a hard mask 1402 is patterned over the surface of the structure, and an etch 1404 is carried out to form a series of trenches 1406 extending into the EPI layer 104. In one embodiment the hard mask 1402 could comprise a nitride, but other embodiments the hard mask 1402 could comprise some other type of mask.

Figure 14:
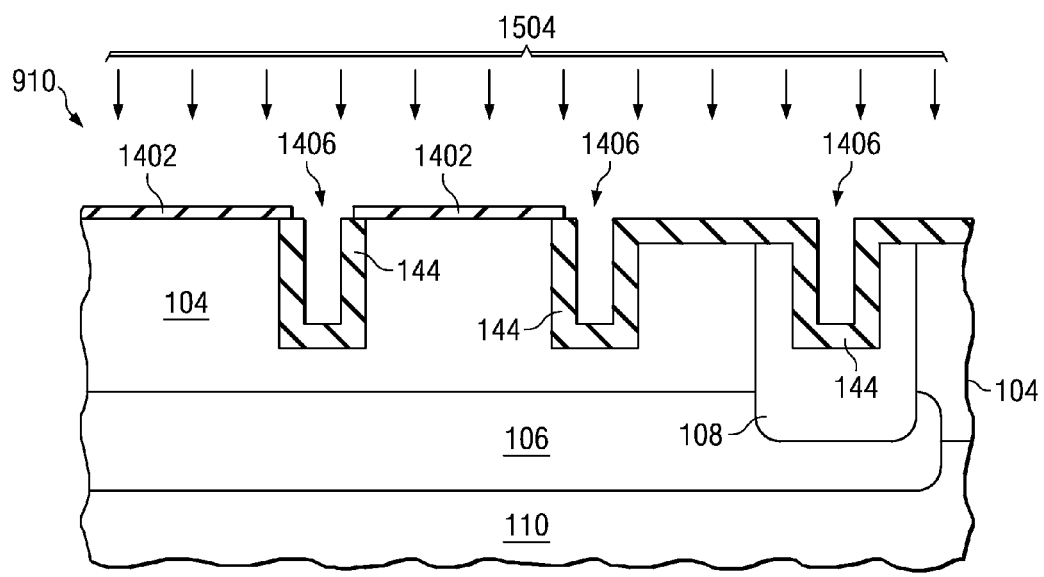

In FIG. 14, (910), while the hard mask 1402 is still in place, a field plate dielectric 144 is conformally formed on the sidewalls and bottom of the trenches 1406. In one embodiment, this field plate dielectric 144 could be formed by using a wet oxidation 1504 that is carried out for a long time period (e.g. 30 min to more than one hour) at a high temperature and could have a thickness of a few-hundred um.

Figure 15:
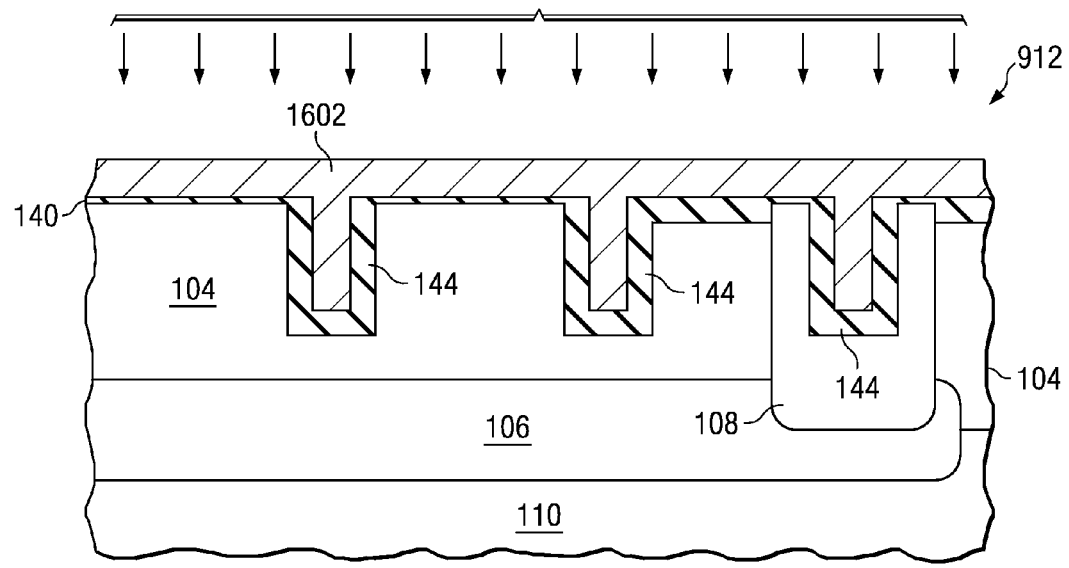

In FIG. 15 (912), a gate dielectric layer 140 is formed over the exposed EPI layer 104, field plate dielectric 144. Next, a layer of electrode material 1602, which corresponds to the gate electrode 136, is formed over the gate dielectric 140 and field plate dielectric 144. The gate dielectric material 140 generally comprises an oxide (or other dielectric)-based material and/or a high-k material, for example, and is relatively thin, being formed to a thickness of between about 1 nm and about 50 nm, for example. The layer of electrode material 1602 generally comprises a polysilicon (or other semiconductor) based material, but could also comprise a metal, and is formed to a thickness of between about 100 nm and about 400 nm, for example.

Figure 16:
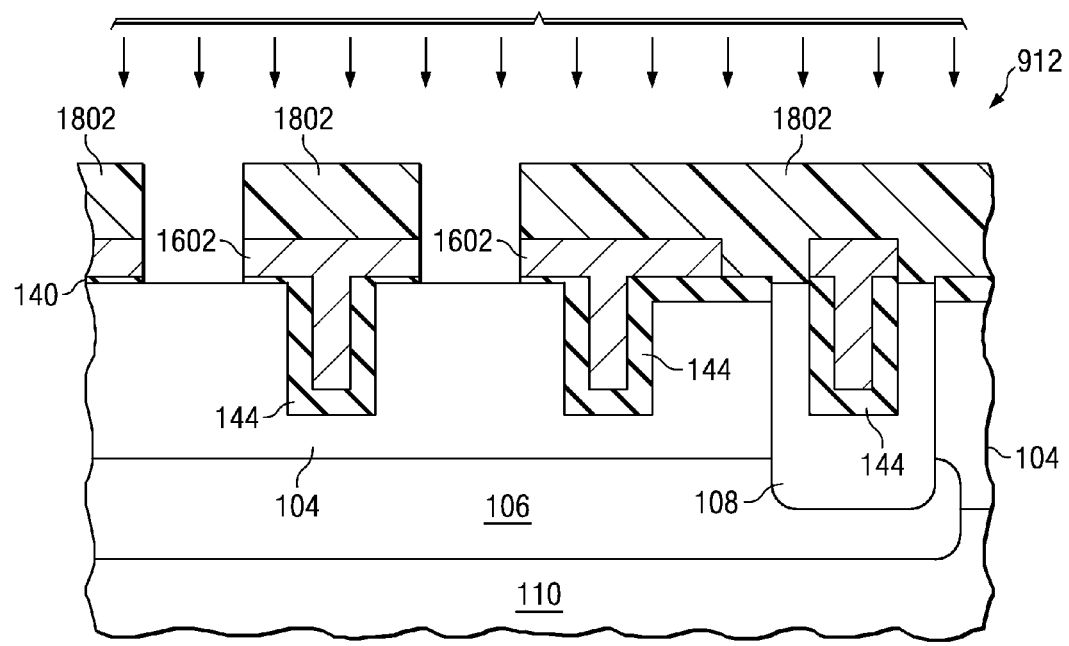

In FIG. 16 (912), the layer of electrode material 1602 and the gate dielectric layer 140 are then patterned using a mask 1802 to expose merely some of the EPI layer 104.

Figure 17:
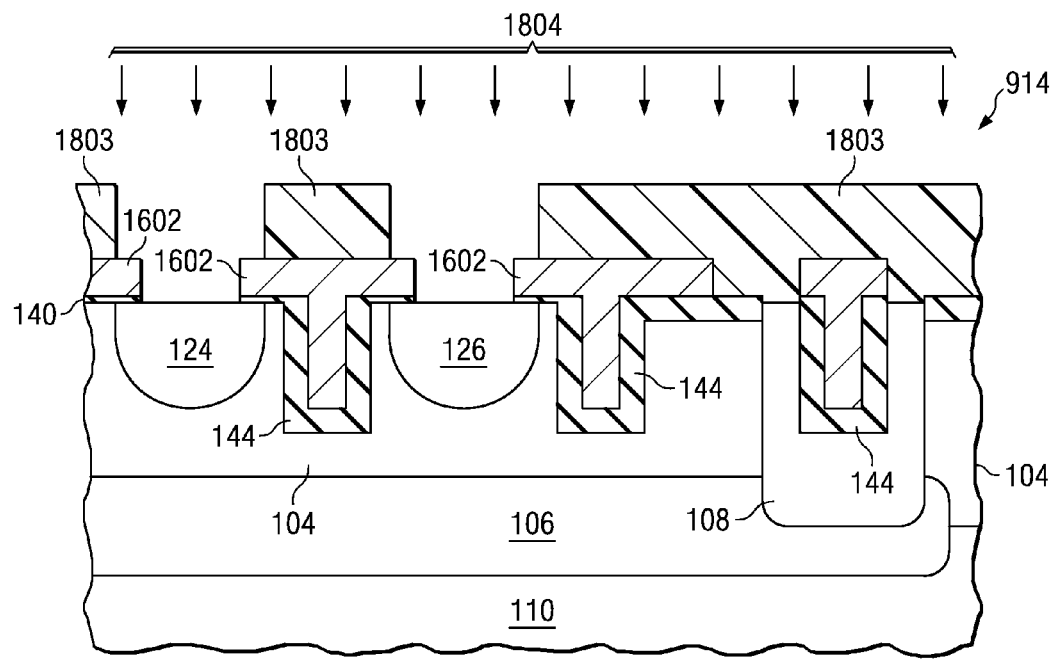

In FIG. 17 (914), while another photoresist mask 1803 is present, the shallow well implants 124, 126 of second conductivity type are formed in the EPI layer 104 spaced apart from the deep well 108. The shallow wells 124, 126 can have a peak doping concentration in the range 5e16 to 5e18 cm-3, for example. In smart power technologies, the shallow wells can constitute the backgate of a DMOS (double diffused MOS transistor), or the backgate of low-voltage MOS transistors in which case they should be implanted prior to the gate oxide and gate electrode layers. In both cases, the well can be obtained by a chain of several implants (different energy/doses/tilts etc) for the purpose of threshold, breakdown or parasitic NPN gain engineering. Even though the figure shows only 2 shallow wells, usual vertical DEMOS devices can include from 1 to 20 or more of such wells, the maximum number of wells being limited by the sheet resistance of the buried layer 106.

Figure 18:
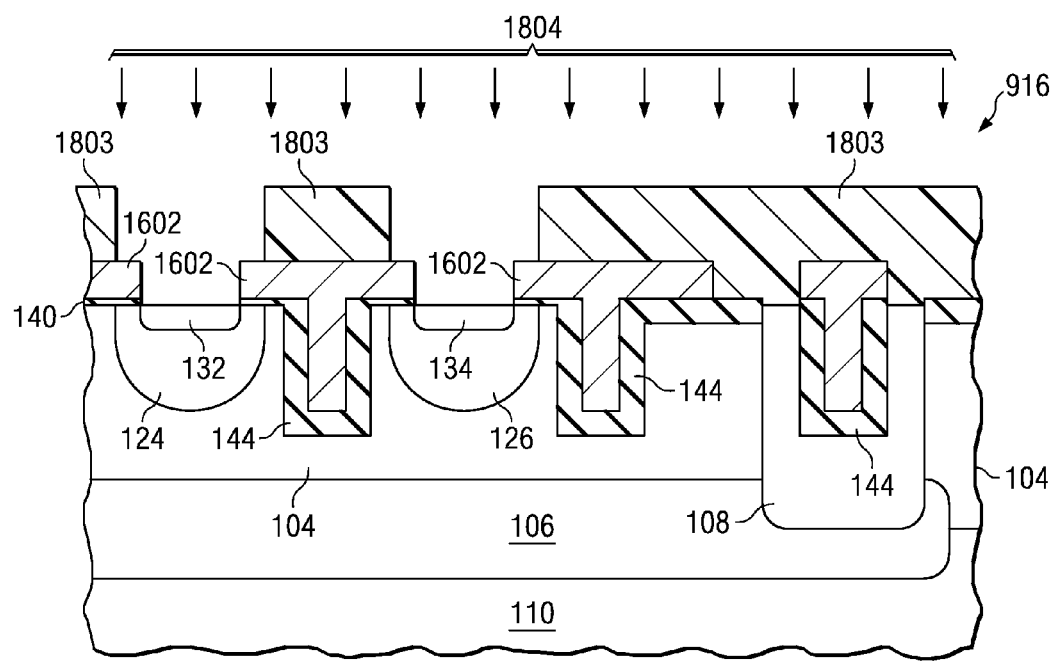

In FIG. 18 (916), third and fourth shallow implants 132, 134 having the first conductivity type are formed in the shallow wells 124, 126. In a smart power process, the shallow implants can be the source region of DMOS transistors or the source/drain region of low-voltage MOS transistors or a combination of both. The third and fourth shallow implants can be formed using a dedicated mask, or by implantation through the same mask 1803 as for the shallow wells 124, 126 eventually self-aligned with the poly openings as represented in the example of FIG. 18. In the second case of using a CMOS N+ implant, the photoresist mask would be different from 1803, it would cover the future p+ region and its edge would be pulled back on the poly—this is more complicated to draw, here we show only the "DMOS" case. In this case the channel length of the VDMOS device results from the differential diffusion of the dopants used in shallow implant regions and shallow wells, whereby the diffusion length of the dopant of first conductivity is smaller than the one of the dopant of second conductivity. It can be appreciated that utilizing a single patterned resist/mask in association with multiple implantations streamlines the fabrication process, at least, by reducing the number of patterning activities that have to be performed.

Figure 19:
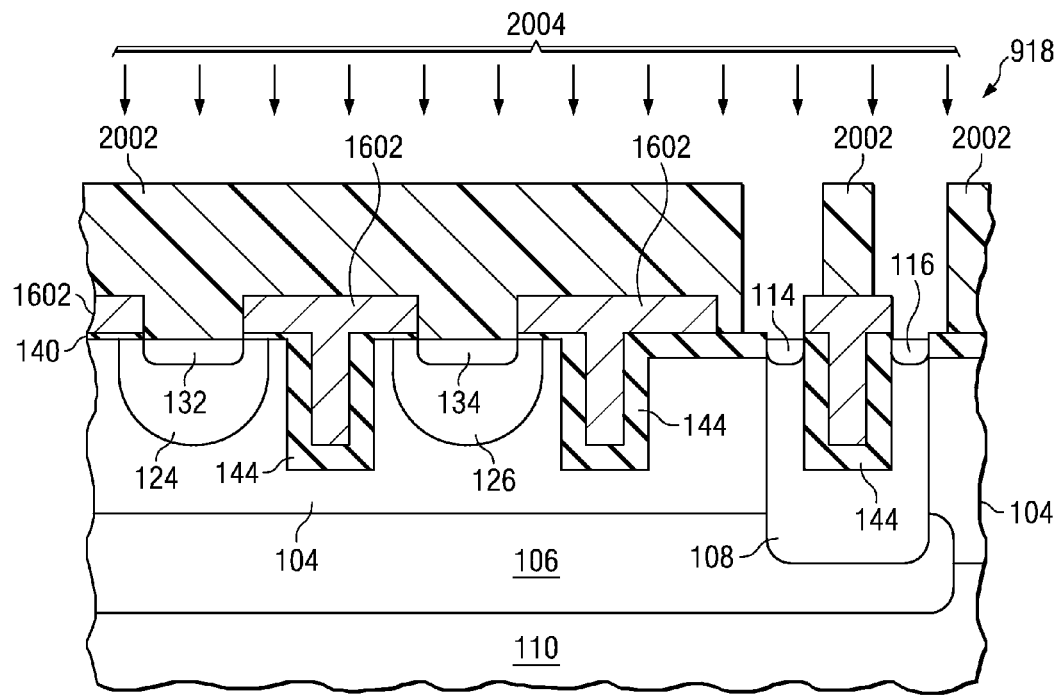

In FIG. 19 (918), another photoresist mask 2002 is formed, through which another implant 2004 is carried out. In this manner the first and second shallow implant regions 114, 116 having the first conductivity type are formed in the deep well 108. For example, these shallow implant regions can be used for the source-drain diffusion of low-voltage NMOS transistors. It is a heavily doped (e.g., peak doping ~1E20 cm-3) of which the purpose is to provide a low-ohmic contact to the deep well 108. The same implant can be used as contact implant of the source.

Figure 20:
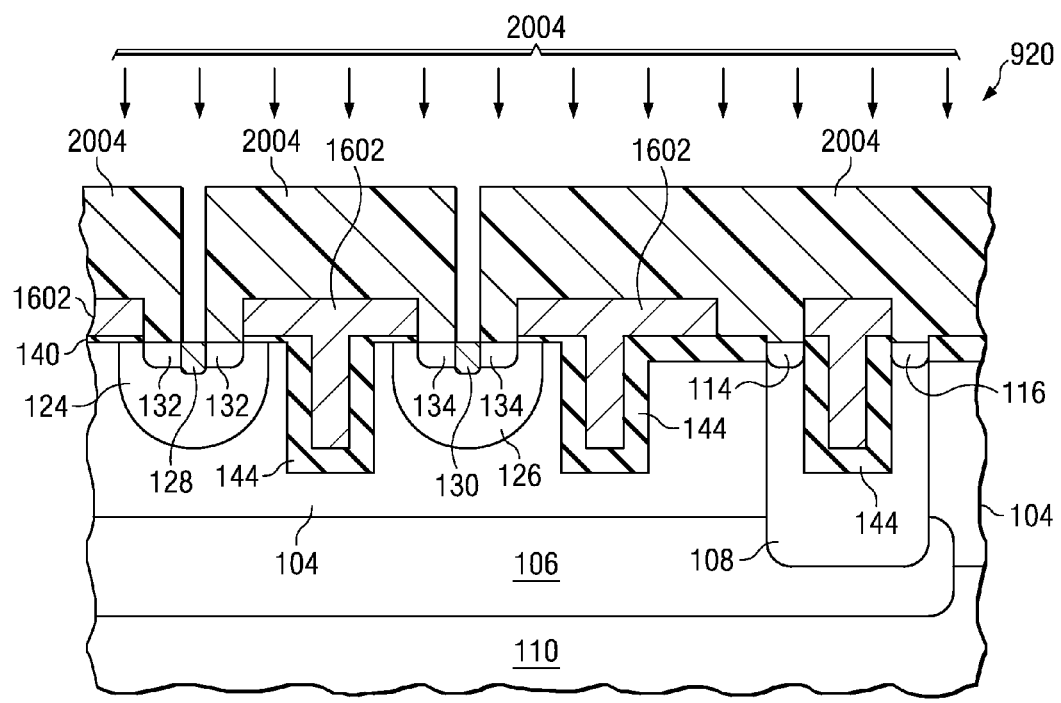

In FIG. 20 (920), another mask 2004 is formed. Heavily doped first and second contact implants 128, 130 having the second conductivity type are respectively formed between or through the second third and fourth shallow implant regions 132, 134 and down into the first and second shallow wells 124, 126 in case the shallow implants 132, 134 have been implanted self-aligned with 124, 126. In case the contact implants 128, 130 are performed into the shallow implant regions (for example a DMOS source implant implanted with the same mask as for the wells 120), they have a concentration of second conductivity type (e.g., p or n type) dopants that is sufficient to overpower/overcome the concentration of first conductivity type (e.g., n or p type) dopants of the first and second shallow implant regions and that is sufficient to allow the first and second contact implants to be defined or identified in the first and second shallow wells.

Back end processing terminates device fabrication is performed at 922. By way of example, one or more conductive and/or dielectric layers can be formed and/or patterned during back end processing.

While reference is made throughout this document to exemplary structures in discussing aspects of methodologies described herein, those methodologies are not to be limited by the corresponding structures presented. Rather, the methodologies (and structures) are to be considered independent of one another and able to stand alone and be practiced without regard to any of the particular aspects depicted in the Figs. Additionally, layers described herein, can be formed in any suitable manner, such as with spin on, sputtering, growth and/or deposition techniques, etc.

Also, equivalent alterations and/or modifications may occur to those skilled in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein. Further, some regions that are illustrated as having distinct or abrupt edges may not be so precisely delineated, but may instead blend slightly with other regions. This is particularly true of doped or implanted regions that may diffuse with other regions, particularly at abutting edges.

What is claimed is:

1. An integrated circuit that includes a vertical diffused power metal-oxide semiconductor (VDMOS) transistor, the VDMOS transistor comprising:
   a buried layer having a first conductivity type in a semiconductor body having a second conductivity type;
   an epitaxial (EPI) layer having the first conductivity type and disposed above the buried layer;
   a deep well having the first conductivity type in the EPI layer extending down to the buried layer;
   a shallow well having the second conductivity type in the EPI layer, wherein the shallow well is spaced apart laterally from the deep well;
   a surface implant region having the first conductivity type and disposed in the shallow well; and
   a gate electrode having a lateral component extending over an edge of the shallow well, and
   a vertical trench comprising a field plate extending vertically into the EPI layer and isolated from the EPI layer by a field plate dielectric layer.

2. The integrated circuit of claim 1, further comprising:
   a gate dielectric sandwiched between the lateral component of the gate electrode and the shallow well;
   wherein the field plate dielectric layer is thicker than the gate dielectric.

3. The integrated circuit of claim 1, wherein the field plate dielectric layer has different thicknesses along the trench walls in the direction of the depth, length or width.

4. The integrated circuit of claim 1, wherein the field plate is electrically connected to the gate electrode.

5. The integrated circuit of claim 4, wherein the field plate and gate electrode comprise a continuous polysilicon layer.

6. The integrated circuit of claim 1, wherein the gate electrode is configured to carry a gate voltage and the field plate is set to an independent potential.

7. The integrated circuit of claim 1, wherein the gate electrode is configured to carry a gate voltage and the field plate is configured to float.

8. The integrated circuit of claim 7, wherein:
   the vertical trench penetrates through the buried layer into the semiconductor body.

9. The integrated circuit of claim 8, wherein:
   vertical trenches are distributed across the epitaxial layer as unconnected plugs of polygonal or circular geometry.

10. The integrated circuit of claim 1, further comprising:
   a trench formed within the deep well extending vertically from the surface of the EPI layer into the deep well above the buried layer.

11. The integrated circuit of claim 10, further comprising:
   an outer dielectric layer disposed along at least a sidewall of the trench within the deep well.

12. The integrated circuit of claim 10, wherein:
   the trench within the deep well comprises a conductor or semi-conductor layer within an outer dielectric layer or connected to the deep well at the trench top, bottom or side.

13. The integrated circuit of claim 12, wherein:
   the trench within the deep well is processed within the same acts as the field plate.

14. The integrated circuit of claim 12, wherein:
   the trench within the deep well penetrates through the buried layer into the semiconductor body.

15. The integrated circuit of claim 14, wherein:
   the trench within the deep well provides isolation between EPI regions of the integrated circuit.

16. The integrated circuit of claim 1, further comprising:
   a shallow implant region having the first conductivity type and formed in the shallow well.

17. An integrated circuit that includes a vertical diffused power metal-oxide semiconductor (VDMOS) transistor, the VDMOS transistor comprising:
   a buried layer having a first conductivity type in a semiconductor backgate having a second conductivity type;
   an epitaxial (EPI) layer having the first conductivity type and formed above the buried layer;
   a deep well having the first conductivity type in the EPI layer extending down to the buried layer and forming an enclosure;
   a number of shallow wells having the second conductivity type in the EPI layer and within the enclosure;
   a number of shallow implant regions having the first conductivity type and formed in the shallow wells;
   a gate electrode that at least partially laterally surrounds a shallow well and has a lateral component that overlies an edge of the shallow well,
   a vertical trench field plate extending vertically into the EPI layer.

18. The integrated circuit of claim 17, wherein the vertical trench field plate and gate electrode comprise a continuous polysilicon layer.

19. The integrated circuit of claim 17, further comprising:
   a field plate dielectric sandwiched between the vertical trench field plate and the EPI layer,
   a gate dielectric sandwiched between the gate electrode and the shallow well; the field plate dielectric being thicker than the gate dielectric.

20. The integrated circuit of claim 17, further comprising:
   a first contact implant having the second conductivity type in and through the first shallow implant and into the first shallow well, wherein the first contact implant is heavily doped relative to the first shallow implant.

21. The integrated circuit of claim 17, where the gate electrode is configured to carry a gate voltage and the vertical trench field plate is configured to float.

22. The integrated circuit of claim 17, further comprising:
   a trench formed within the deep well comprising an outer dielectric layer and an inner conductive layer and extending vertically from the surface of the EPI layer into the deep well above the buried layer.

23. The integrated circuit of claim 16, wherein the inner conductive layer directly contacts the buried layer.

24. An integrated circuit that includes a vertical drain extended transistor, the transistor comprising:
   a drain having a first conductivity-type and formed at least partially in a semiconductor body, the drain at least partially underlying an active area of the vertical drain extended transistor and including a deep well vertically abutting the active area;

a body or backgate having a second conductivity-type and spaced apart laterally from the deep well;

a source having the first conductivity type and associated with the body or backgate;

a gate electrode having a lateral component extending over an edge of the body or backgate and stopping at some spacing from an edge of the source, and having a vertical trench field plate extending vertically into the active area.

* * * * *